United States Patent
Kang

[11] Patent Number: 6,122,218
[45] Date of Patent: *Sep. 19, 2000

[54] MULTI-PORT ACCESS MEMORY EMPLOYING A COMMON READ/WRITE PORT

[75] Inventor: Hoai Sig Kang, Kyoungki-do, Rep. of Korea

[73] Assignee: Hyundai Electronics Industries Co., Ltd., Kyoungki-do, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/975,711

[22] Filed: Nov. 21, 1997

[30] Foreign Application Priority Data

Nov. 21, 1996 [KR] Rep. of Korea ...................... 96-56161

[51] Int. Cl.$^7$ ........................................................ G11C 8/00

[52] U.S. Cl. .................. 365/230.05; 365/189.02; 365/194; 365/203; 365/230.02; 365/230.06

[58] Field of Search ........................ 365/230.05, 230.02, 365/189.02, 230.06, 203, 194

[56] References Cited

U.S. PATENT DOCUMENTS

| | | | |
|---|---|---|---|
| 4,891,795 | 1/1990 | Pinkham et al. | 365/230.03 |
| 5,235,552 | 8/1993 | Nakajima et al. | 365/195 X |
| 5,257,236 | 10/1993 | Sharp | 365/230.05 |
| 5,303,200 | 4/1994 | Elrod et al. | 365/230.05 |
| 5,546,569 | 8/1996 | Proebsting et al. | 365/189.04 X |
| 5,555,398 | 9/1996 | Raman | 395/470 |
| 5,777,928 | 7/1998 | Vidwans et al. | 365/230.06 X |

*Primary Examiner*—Do Hyun Yoo
*Attorney, Agent, or Firm*—Jacobson, Price, Holman & Stern, PLLC

[57] ABSTRACT

This invention is developed to provide a multi-port access memory having: a multi-port access memory cell block for storing data; a number of decoder for receiving an address for reading and writing the data and, in response to a read enable signal or a write enable signal, for decoding the address to thereby select one of word lines of the multi-port access memory cell block; and data selection circuit in response to the write enable signal, for relaying input data via a bidirectional data line to the multi-port access memory cell and, in response to the read enable signal, for receiving the data stored in the multi-port access memory cell to thereby provide the stored data.

11 Claims, 10 Drawing Sheets

MULTI-PORT ACCESS MEMORY EMPLOYING A COMMON READ/WRITE PORT

FIELD OF THE INVENTION

The present invention relates to a multi-port access memory, for use in a super scalar structured microprocessor, and, more particularly, to an improved multi-port access memory which is capable of effectively performing the read and the write operations thereof by using a common read and write port to thereby substantially reduce the size and the delay time thereof.

DESCRIPTION OF THE PRIOR ART

Computer systems or various control units are generally provided with a multi-port access memory. Specifically, in a register file system, a reordering buffer, or a reservation station fist-in-first-out (FIFO) buffer, which is used in a super scalar microprocessor, read and write operations are conventionally supported by using a number of input/output ports.

Referring to FIG. 1, there is shown a schematic block diagram of a conventional multi-port access memory. The multi-port access memory includes a plurality of write address decoder blocks 101, a memory cell block 102 and a plurality of read address decoder blocks 103.

As shown, the conventional multi-port memory is provided with two data input and output ports: a read data output port and a write data input port; and a number of address input ports: m number of read address ports and m number of write address ports. Each of the read address ports 1 to m is coupled to n-bit read address decoder blocks. The n-bit read address decoder block receives an n-bit read address and decodes it to select or enable one of $2^n$ decode lines constituting of a read decode port, which are connected to the memory cell block 102, wherein n and m are a positive integer. In a similar manner, each of the write address ports 1 to m is connected to n-bit write address decoder block. The n-bit write address decoder blocks receives an n-bit write address and decodes it to select or enable one of $2^n$ decode lines constituting of a write decode port, which are connected to the memory cell block 102. Consequently, m number of the read and the write address ports are coupled to m number of the decoder blocks, respectively and $2^n \times m$ number of decode lines are coupled to the memory cell block.

Referring to FIG. 2, there is shown a detailed circuit diagram of a decoder block shown in FIG. 1, which include a number of 2-bit decoders. As shown, since the decoder block includes a multiplicity, e.g., n/2, of 2-bit decoders, the total delay time of the decoder block is determined by multiplying a delay time of a 2-bit decoder with n/2. And a total number of 2-bit decoders TD is calculated as follows:

$$TD = \sum_{i=1}^{\frac{n}{2}} 2^{2(i-1)}$$

As can be seen from the above equation, it can be noticed that, when the number of bits is increased, the size of the decoder should be increased and the delay time thereof is also increased.

Referring to FIG. 3, there is shown the cell structure of the memory cell block shown in FIG. 1. Specifically, a storage cells 304 is described and is coupled via a number of read switch transistors 305 and a number of write switch transistors 303 to a number of read data output lines and a number of write data input lines, respectively. The storage cell 304 contains two invertors connected in a direct latch type. Each of the read switch transistors 305 is coupled between the storage cell 304 and the corresponding read data output line and controlled through the use of the corresponding read address decoder block 103 shown in FIG. 1. In a similar manner, each of the write switch transistors 303 is connected between the storage cell 304 and the corresponding write data input line and controlled by using the corresponding write address decoder block 101. That is, in the write operation, a write switch transistor 303 is turned on by using a decoded write address outputted from the corresponding write address decoder block 101 shown in FIG. 1 and write data is then coupled to the storage cell 304 via the corresponding write data input line to thereby be stored therein. On the other hand, in the read operation, a read switch transistor 305 is turned on by using a decoded read address outputted from the corresponding read address decoder block 103 shown in FIG. 1 so that a read data stored in the storage cell 304 is converted by using the corresponding inverter and then outputted therefrom via the corresponding read data output line.

In the conventional multi-port access memory, there is a problem that, since nodes 301 and 302 of each storage cell have necessarily a substantially great junction static capacitor, the sizes of NMOS read and write switch transistors 305 and 303, and the storage cells 304 should be greatly increased in order to obtain a fast access time thereof. Therefore, it is needed to provide an improved multi-port access memory having a reduced size and a fast access time to the super scalar structured microprocessor.

SUMMARY OF THE INVENTION

It is, therefore, a primary object of the invention to provide an improved multi-port access memory which is capable of effectively reducing the size and the delay time thereof by employing a common read and write port.

In accordance with the present invention, there is provided a multi-port access memory comprising: a multi-port access memory cell block for storing data; a number of decoding means for receiving an address for reading and writing the data and, in response to a read enable signal or a write enable signal, for decoding the address to thereby select one of word lines of the multi-port access memory cell block; and data selection means, in response to the write enable signal, for relaying input data via a bidirectional data line to the multi-port access memory cell and, in response to the read enable signal, for receiving the data stored in the multi-port access memory cell to thereby provide the stored data.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENT

The embodiment of this invention will be described in detail with reference to the accompanying drawings of FIGS. 4 to 12.

Figure 1:
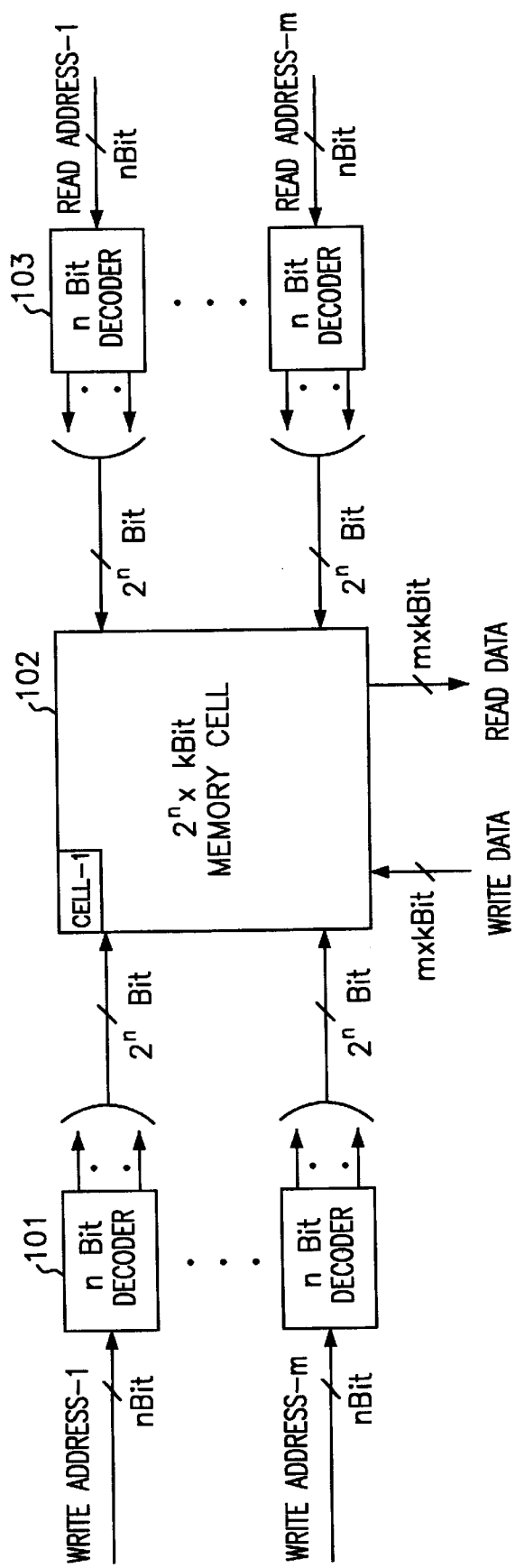
FIG. 1 illustrates a schematic block diagram of a conventional multi-port access memory.
Figure 2:
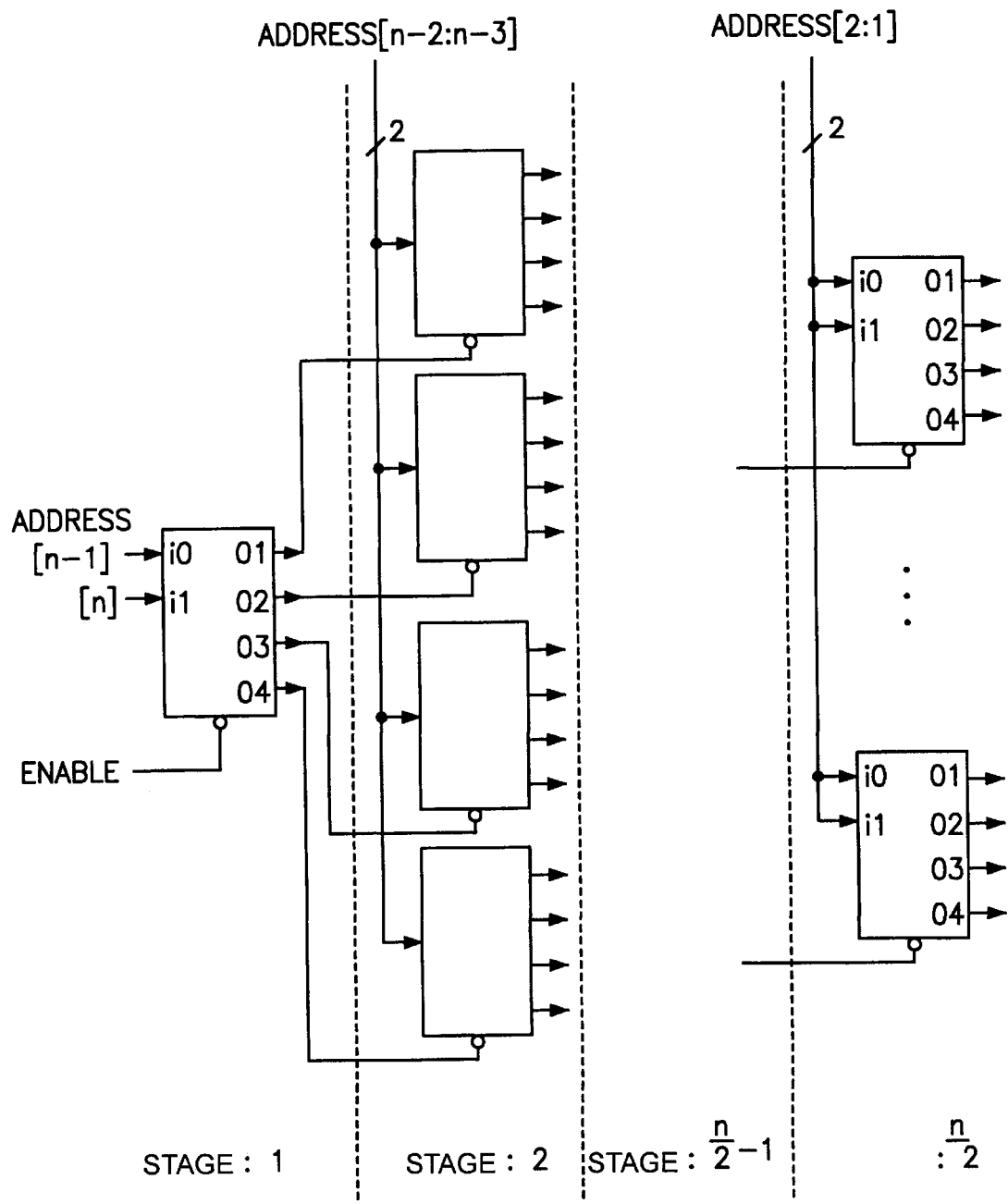
FIG. 2 depicts a schematic block diagram of a decoder block shown in FIG. 1.
Figure 3:
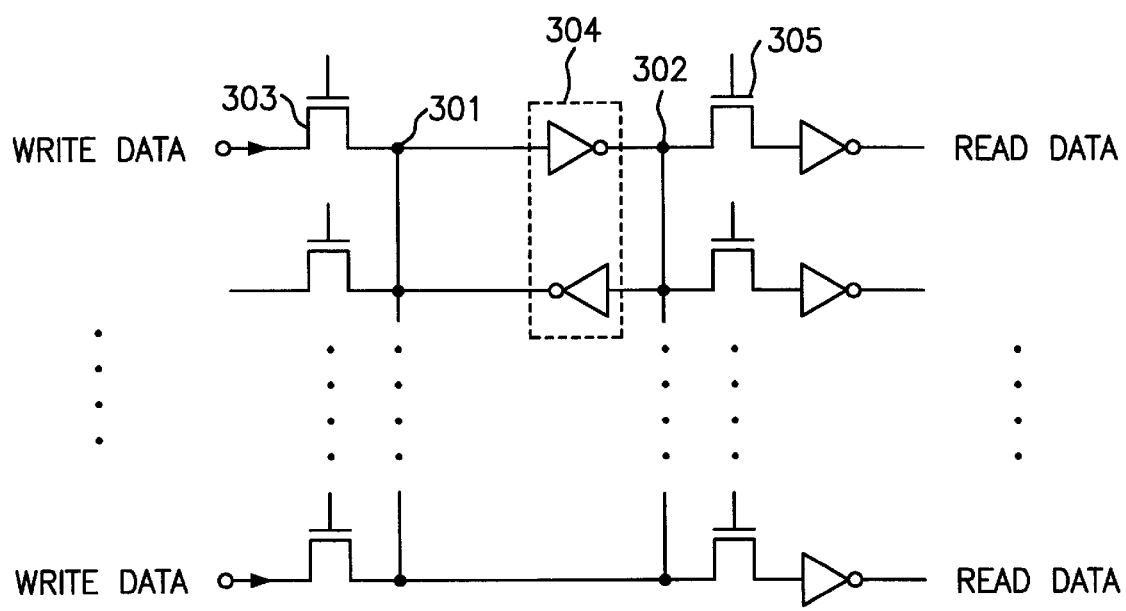
FIG. 3 describes a schematic circuit diagram of the cell structure of the memory cell block shown in FIG. 1.
Figure 4:
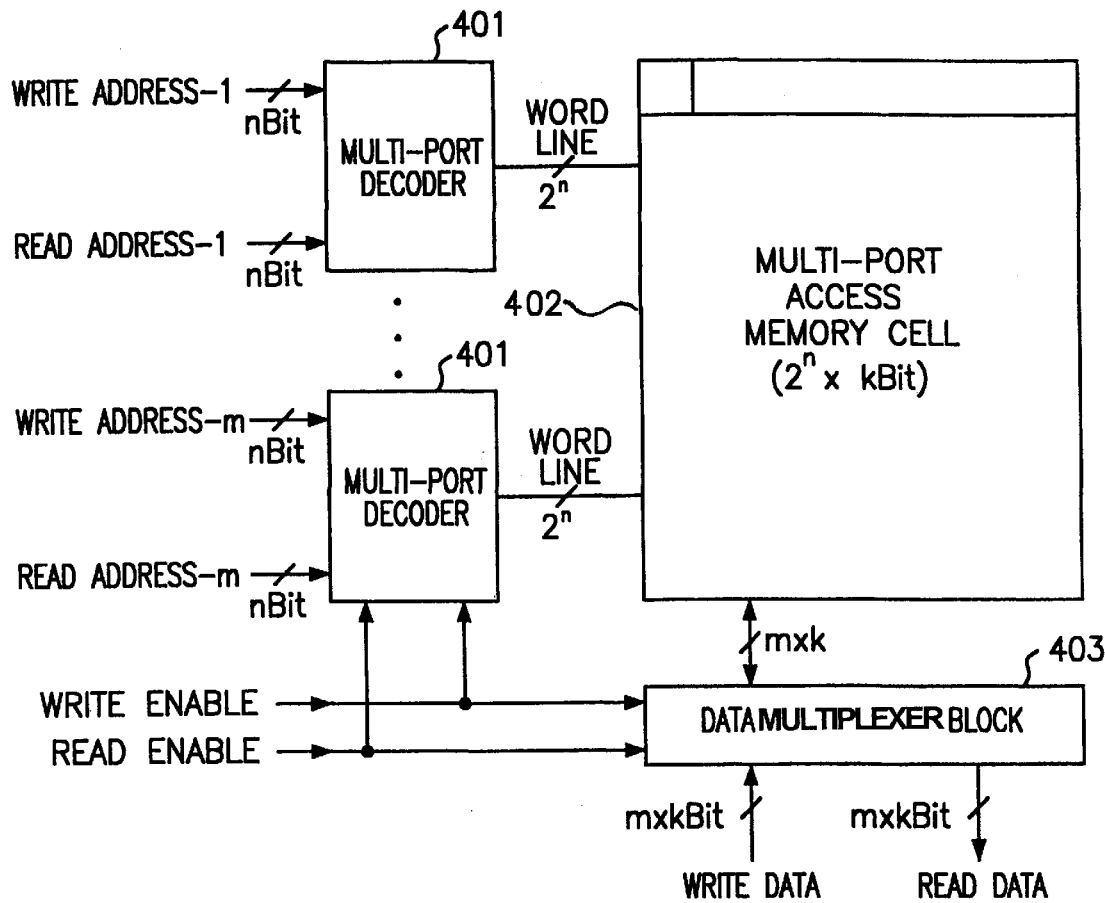
FIG. 4 provides a block diagram of a multi-port access memory in accordance with the present invention.

Referring to FIG. 4, there is shown a multi-port access memory in accordance with the present invention. The multi-port access memory includes m number of multi-port decoder blocks 401, a multi-port access memory cell block 402 and a data multiplexing block 403.

As shown, the multi-port access memory cell block 402 of the present invention is provided with m number of $2^n$-bit word ports, which are connected to m number of the multi-port decoder blocks 401, respectively, and a m×k-bit bidirectional data port, which is coupled to the data multiplexing block 403, wherein m and k are positive integers and each of the word port includes $2^n$ word lines.

The multi-port access memory cell block 402 has a number, e.g., $2^n$×k bits, of storage cells. Each of the multi-port decoder blocks 401 receives n-bit read or write address via n-bit read and writ address ports and, in response to a read enable signal or a write enable signal, decode the read or the write address to thereby select or enable one of $2^n$ word lines contained in the corresponding word port in order to perform the read or the write operation. The data multiplexing block 403 serves to supply write data via a bidirectional data port to the multi-port access memory cell 402, in response to the write enable signal, and to retrieve read data stored in the multi-port access memory cell 402 via the bidirectional data port to relay it to an external device (not shown), in response to the read enable signal.

In a write operation, each of the multi-port decoder block 401 receives n-bit write address and, in response to the write enable signal, decodes it to enable or select a word line of the corresponding word port based on the decoded write address. That is, when the n-bit write address is inputted to the multi-port decoder block 401, the n-bit address is decoded so that one of the word lines contained in the corresponding word port becomes an enable state, i.e., a high voltage state to thereby select a memory cell of the multi-port access memory cell block 402 to be written.

Simultaneously, the write data is relayed to the data multiplexing block 403 which, in response to the write enable signal, provides the write data via the bidirectional data port to the multi-port access memory 402. And then the write data is stored in the selected or enabled memory cell of the multi-port access memory 402 through the use of the multi-port decoder 401.

In a similar manner, in the read operation, each of the multi-port decoder block 401 receives n-bit read address and decodes it to enable or select a word line of the corresponding word port based on the decoded read address, in response to the read enable signal. That is, when the n-bit address is inputted to the multi-port decoder block 401, the n-bit address is decoded so that one of the word lines becomes an enable state, i.e., a high voltage state to thereby select or enable a memory cell of the multi-port access memory cell block 402 to be read.

And the data multiplexing block 403, in response to the read enable signal, previously charges the bidirectional data port, during the above address decoding time, in order to obtain a fast access time. Thereafter, the data is retrieved from the selected or enabled memory cell of the multi-port access memory cell 402 to provide the read data via the bidirectional data port to the external device.

Figure 5:
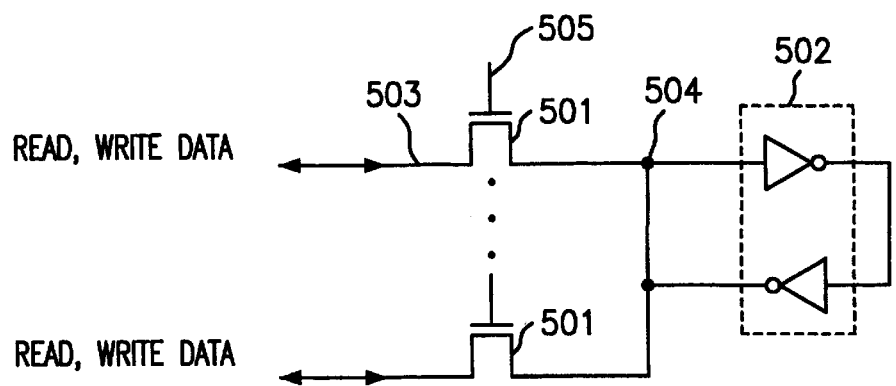
FIG. 5 shows a diagram of the cell structure of the multi-port access memory cell block shown in FIG. 4.

Referring to FIG. 5, there is a cell structure of the multi-port access memory cell block 402, wherein, for the sake of convenience, only one memory cell 502 is described therein.

Although not shown, the multi-port access memory cell block 402 can include $2^n$×k bits memory cells which can be simultaneously read and write accessible by using the bidirectional data port.

As shown, the one memory cell 502 is coupled to a number of switch transistors 501, wherein each of the switch transistors is controlled by using the multi-port decoder 401 and connected a bidirectional data line of the bidirectional data port. The memory cell 502 has two invertors connected in a direct latch fashion.

In the write operation, output signal from the multi-port decoder block 401 is coupled to gates of the switch transistors, e.g., NMOS transistors, 501. When a word line is enabled as a high state by the multi-port decoder 401, the corresponding NMOS switch transistor 501 is turned on. As a result, when the write data is different from data stored in the memory cell 502, the data appearing on the point 504 is inverted, while, when the write data is identical to the stored data, the data appearing on the point 504 is maintained as the current data. Thereafter the write operation is completed.

On the other hand, in the read operation, when a word line is converted as a high voltage state, e.g., an enable state by the multi-port decoder block 401, the corresponding NMOS transistor 501 is turned on and the data stored on the point 504 is relayed via the corresponding NMOS switch transistor 501 to the bidirectional data line 503.

As may be seen from the above, in the multi-port access memory cell 402, it is readily appreciated that the write and the read operations can be performed through the use only of one bidirectional data port to thereby effectively manage the access time because the storage structure of the direct latch and the size of the NMOS transistor 501 are only depend on the junction capacitance of the node 504, the junction capacitance of the node 503 and the load capacitance of word line 505.

Figure 6:
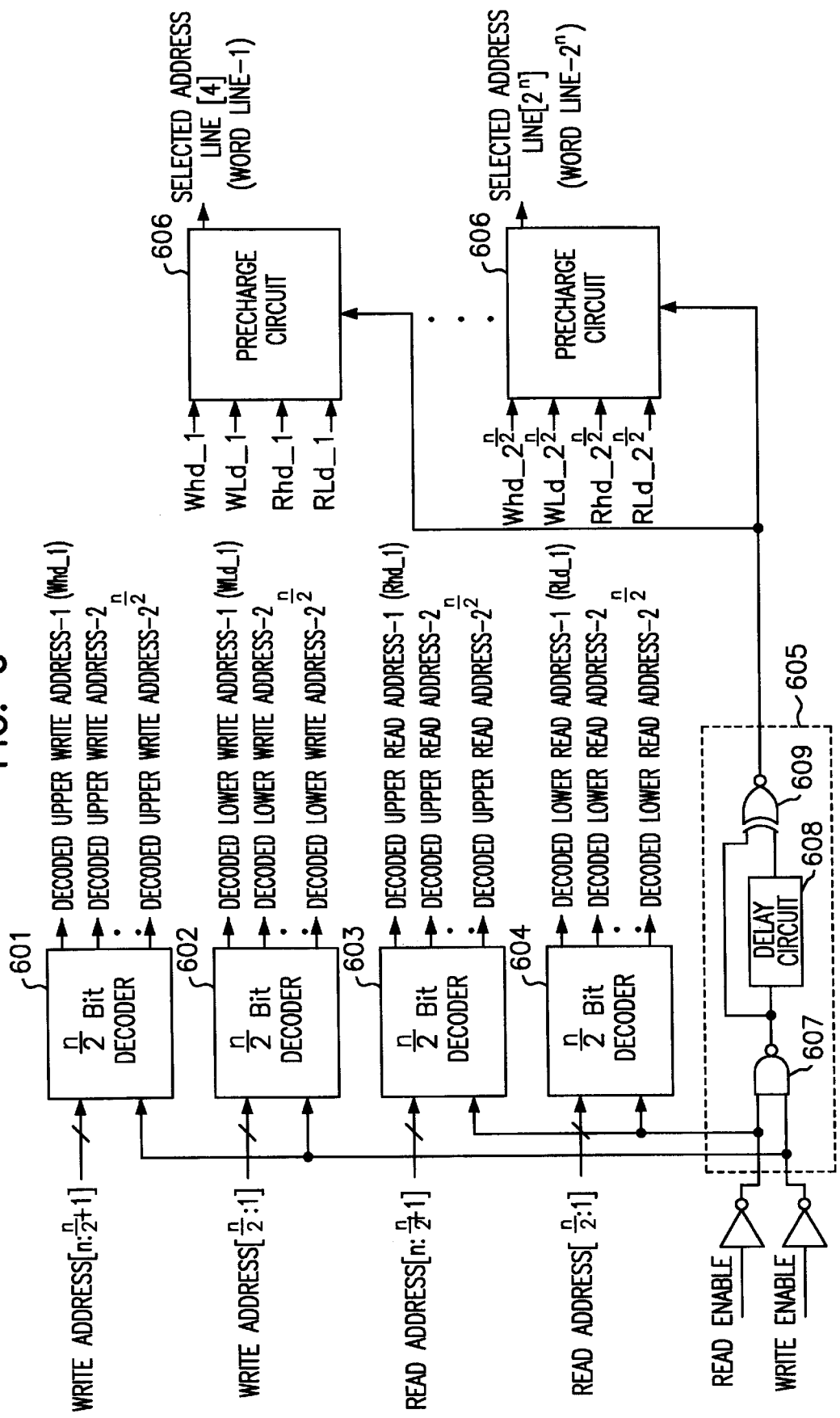
FIG. 6 shows a block diagram of a multi-port decoder block shown in FIG. 4.

Referring to FIG. 6, there is illustrated a detailed block diagram of the multi-port decoder block 401 which includes n/2 bit decoder 601 to 604, a pre-charge control signal generator 605 and $2^n$ number of pre-charge circuits 606.

Each of the multi-port decoder is provided with 4 number of n/2 bit decoders 601 to 604, which serve to independently decoding upper bits and lower bits of a read and a write address, and $2^n$ number of the pre-charge circuits 606. It also includes the pre-charge control signal generator 605 which servers to provide a word line pre-charge enable signal to $2^n$ number of the pre-charge circuit 606.

Each of the n/2 decoder 601 and 602 receives upper n/2 bits and lower n/2 bits of the write address in response to an inverted write enable signal, respectively, and decodes them to provide a decoded address signal Whd_1 to Whd_$2^{n/2}$ and WLd_1 to WLd_$2^{n/2}$ via the $2^n$ decode lines to the pre-charge circuits 606. Each of the n/2 decoder 603 and 604 receives upper n/2 bits and lower n/2 bits of the read address in response to an inverted read enable signal, respectively, and decodes them to provide a decoded address signal Rhd_1 to Rhd_$2^{n/2}$ and RLd_1 to RLd_$2^{n/2}$ via the $2^n$ decode lines to pre-charge circuit 606.

The precharge control signal generator 605 includes NAND gate 607 for receiving and detecting an inverted read enable signal and an inverted write enable signal to generate an NANDed signal; a delay circuit 608 for delaying the NANDed signal to generate a delayed NANDed signal; and an Exclusive NOR gate 609 for receiving the NANDed signal and the delayed NANDed signal to generate the word line pre-charge enable signal when the NANDed signal is different from the delated NANDed signal.

That is, the NAND gate 607 receives the read and the write enable signals and, when one of them is of a high voltage state or both of them is of a high voltage state, generates a detection signal as a high voltage state. The delay circuit 608 receives the detection signal from the NAND gate 607 to delay it during a predetermined pre-charge time (t1 shown in FIGS. 11 and 12) to thereby provide a delayed detection signal to the Exclusive NOR gate 609. The Exclusive NOR gate 609 generates the word line pre-charge enable signal as a low voltage state when the detection signal outputted from the NAND gate 607 is different from the delayed detection signal outputted from the delay circuit 608. The word line precharge enable signal is then applied to the $2^n$ number of precharge circuits 606.

Each of the pre-charge circuits 606 is precharged by a reference voltage Vdd in response to the word line precharge enable signal; and then receives the decoded upper and lower bits of the write or the read address for the corresponding word line. When all the decoded upper and lower bits of the write address or read address are of a high voltage state, each of the precharge circuits 606 generates a decoded write or read address having a high voltage state which is coupled to the corresponding word line.

Figure 8:
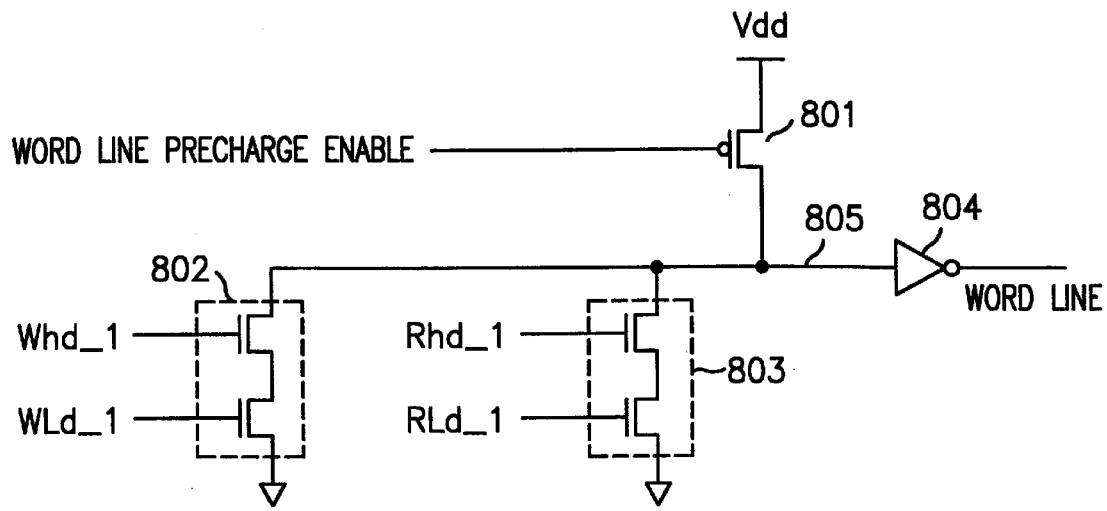
FIG. 8 describes a detailed circuit diagram of the pre-charge circuit shown in FIG. 6.

The precharge circuit 606 precharges the word line 805 shown in FIG. 8 up to the reference voltage Vdd to thereby allow the multi-port decoder block to have a fast decoding time.

Figure 7:
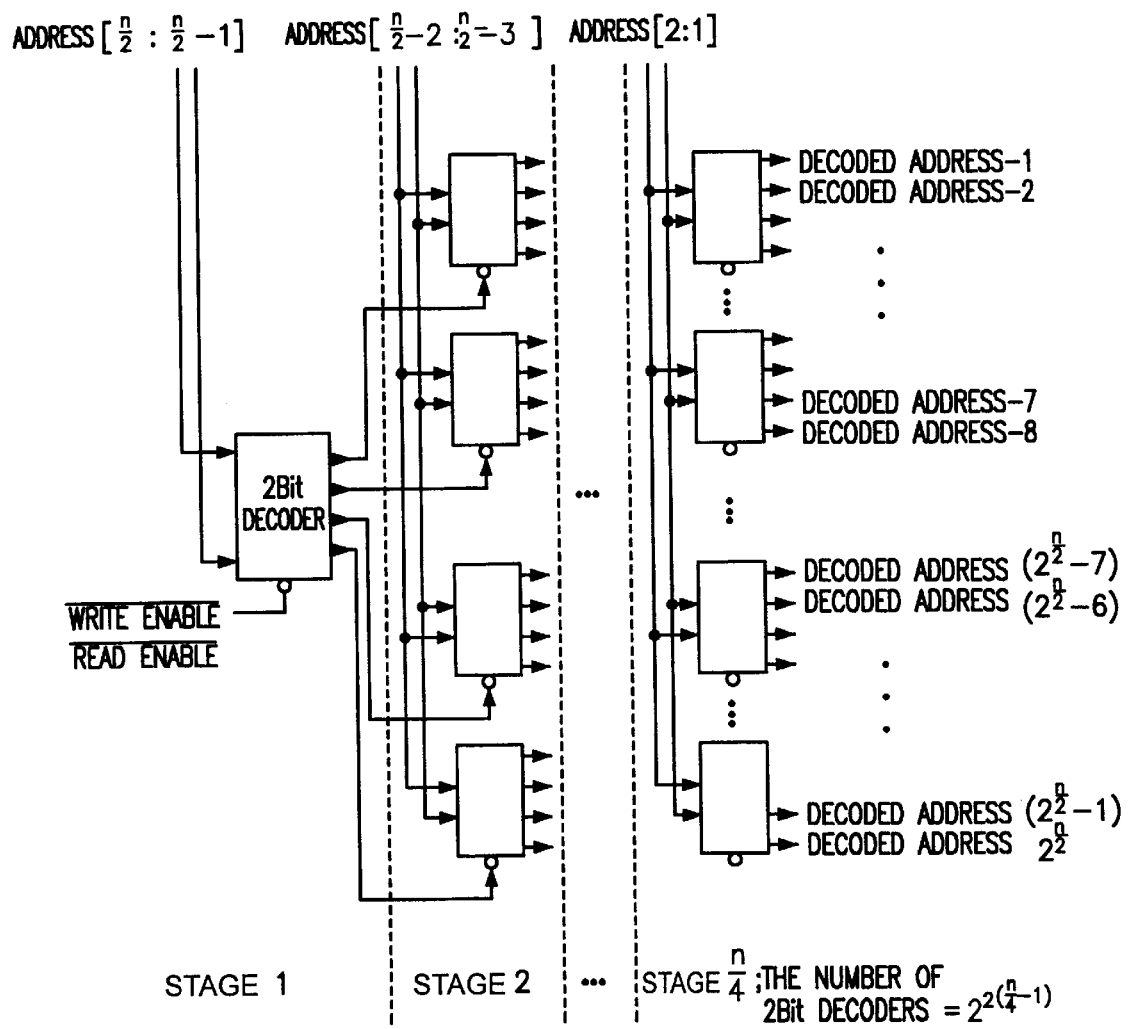
FIG. 7 illustrates a detailed diagram of a n/2-bit decoder block shown in FIG. 6.

Referring to FIG. 7, there is shown a detailed block diagram of the n/2 bit decoder in accordance with the present invention.

In comparison with the conventional n bit decoder, each of the n/2 bit decoder has n/4 stages and total delay time thereof is obtained by multiplying the delay time of a 2-bit decoder by n/4 stages. Total number of 2 bit decoders TD is described as follows:

$$TD = \sum_{i=1}^{\frac{n}{4}} 2^{2(i-1)}$$

As can be seen from the above, it should be appreciated that the total delay time of the multi-port decoder block is reduced up to one half of the conventional multi-port decoder and the total number of the 2-bit decoder can be also reduced by RD which is described as follows:

$$RD = \sum_{i=\frac{n}{4}+1}^{\frac{n}{4}} 2^{2(i-1)}$$

The conventional 2-bit decoder can be advantageously employed in the embodiment of the present invention and serves to perform the 2-bit decoder logic operation.

Referring to FIG. 8, there is depicted a detailed circuit diagram of the precharge circuit 606 which includes a PMOS transistor 801 for precharging the word line 805 up to the reference voltage Vdd in response to the word line pre-charge enable signal; two NAND logic circuits 802 and 803 for discharging the word line 805 when the upper and lower bits of write or read address Whd_1 and WLd_1 or Rhd_1 and RLd_1 are identical to each other; and a inverter 804 for inverting a signal appearing on the word line 805.

The PMOS transistor 801 is turned on, when the word line precharge enable signal is a low voltage state, and the word line 805 is precharged up to the reference voltage Vdd. The first NAND logic circuit 802 receives the decoded upper and lower bit data Whd_1 and WLd_1 for the corresponding word line; and, when both of the upper and lower bit data have a high voltage state, the voltage precharged on the word line 805 is discharged to a ground voltage.

On the other hand, the second NAND logic circuit 803 receives the decoded upper and lower bit data Rhd_1 and RLd_1 for the corresponding word line 805 and, when both of the upper and lower bit data have a high voltage state, the precharged voltage appearing on the word line 805 is discharged to the ground voltage level. And then the inverter 804 converts the ground voltage level on the word line 805 to thereby enable the word line as a high voltage state.

Figure 9:
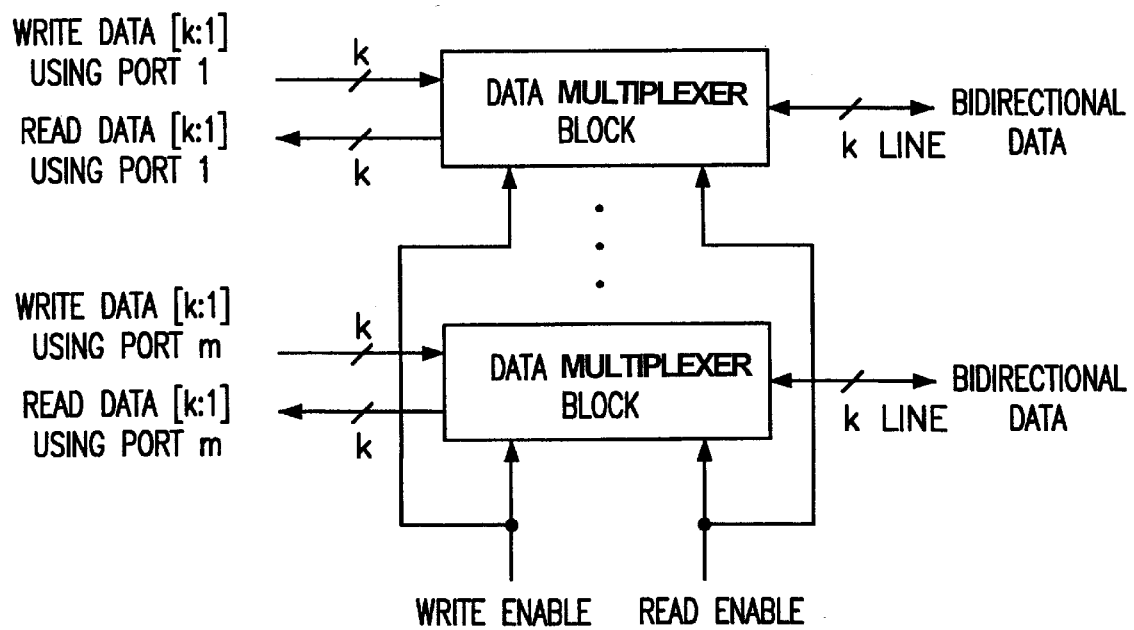
FIG. 9 depicts a block diagram of the data multiplexing block shown in FIG. 4.

Referring to FIG. 9, there is provided with a detailed block diagram of the data selection block, which includes a number of data multiplexers, each of the data multiplexer connected a bidirectional data line.

In accordance with the present invention, the data multiplexing block can effectively serve to combine two path, e.g., the write and read ports into a bidirectional data port.

In write operation, since a propagation time for transferring the write data into the bidirectional data line is relatively short in comparison with the decoding time, there is a time redundancy in the write valid data. While, in read operation, since, after the completion of the decoding operation, the word line is selected and the data stored in the selected memory cell is then read out on the data line, in order to obtain a faster read operation, the bidirectional data line can be precharged up to the high voltage level.

As can be seen from the above, it is readily appreciated that in comparison with the conventional device, the data port can be reduced up to one half thereof by using the inventive data multiplexing block.

Figure 10:
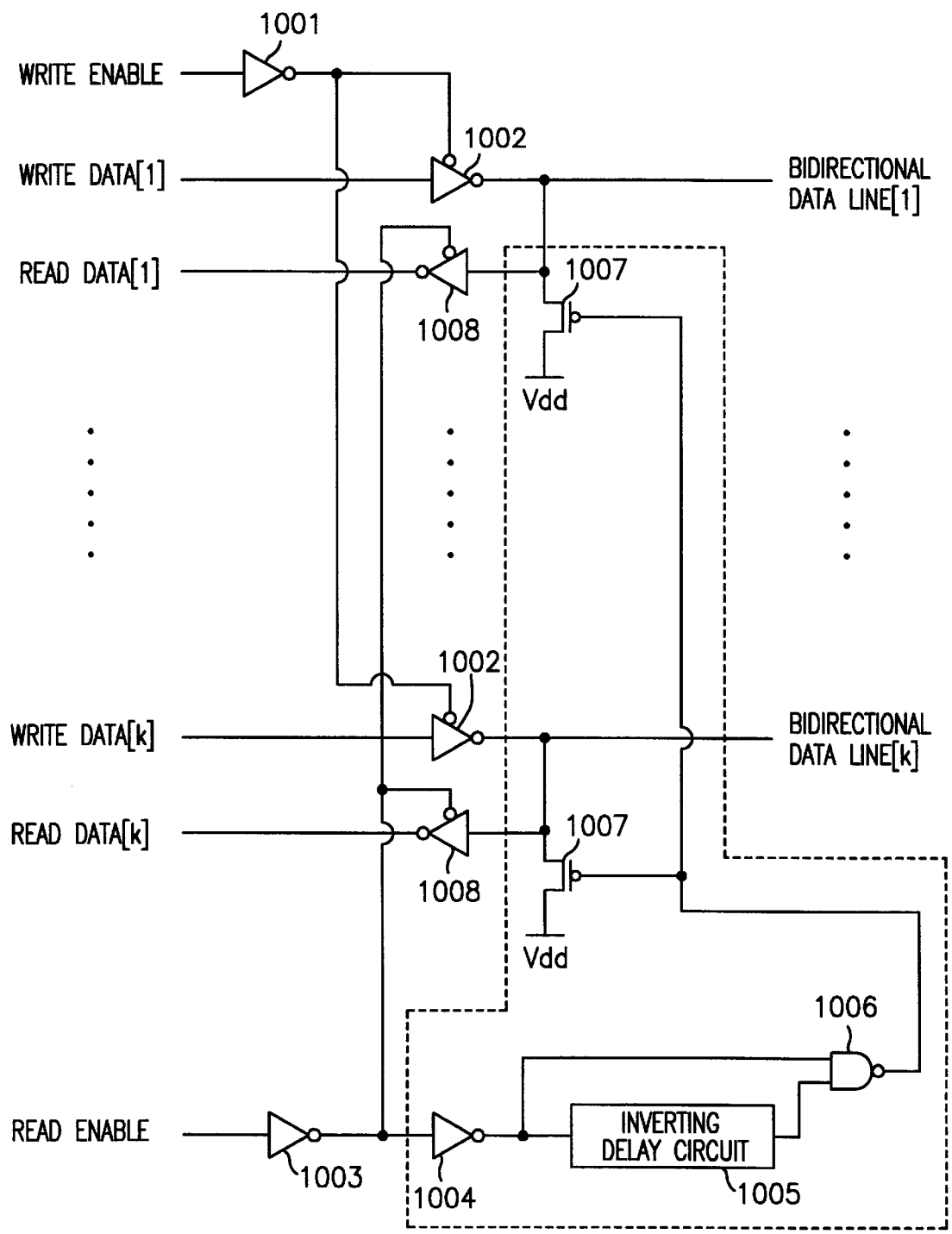
FIG. 10 provides a circuit diagram of the data multiplexer shown in FIG. 9.

Referring to FIG. 10, there is shown a detailed circuit diagram of the data multiplexer. The data multiplexer includes a number of write data transmission devices 1002 for transferring the write data via the bidirectional data line, in response to the inverted write enable signal to the multi-port access memory cell block; a precharge device for precharging the bidirectional data line, in response to the read enable signal having a high voltage state, during the decoding time of read operation; and read data output devices 1008 for relaying the read data retrieved from multi-port access memory cell via the bidirectional data lines to the external device(not shown).

When the write enable signal is a high voltage state and the read enable signal is a low voltage state, the write data transmission devices 1002 relays k-bit write data from the external device via the bidirectional data lines to the multi-port access memory cell.

In this case, the read data transmission devices 1008 receives the read enable signal having a high voltage state outputted from the inverter so that the read data transmission devices 1008 remains in a tri-state for prohibiting a data transmission.

That is, the read and the write transmission devices 1002 and 1008 provide the inverted data via the bidirectional data lines to the external device or the multi-port access memory cell block when the tri-state enable signal has a low voltage level. While, the tri-state enable signal is of a high voltage level, the read and the write transmission devices remains in the tri_state.

The read enable signal is coupled via two invertors 1003 and 1004 to the inverting delay circuit 1005 which delays it by a predetermined time representing the decoding time of the read operation to generate the delayed read enable signal. The read enable signal outputted from the inverter 1004 and the delayed read enable signal are then coupled to the NAND gate 1006 which generates a precharge enable signal having a low voltage state when both of them are a high voltage state. The precharge enable signal is then coupled to gates of PMOS transistors 1007 so that the PMOS transistors 1007 are then turned on. As a result, the bidirectional data lines are selectively precharged during the predetermined time to thereby reduce the power dissipation.

A number, e.g., k, of PMOS transistors 1007 are employed in order to precharge k number of the bidirectional data lines to the reference voltage, each size being limited by amount of the reference voltage and k being a positive integer.

A number, e.g., k, of the read transmission devices 1008 inverts the data located on the bidirectional data lines, when the read enable signal outputted from the inverter 1003 has a low voltage state, to thereby generate the inverted read data. The inverted read data is then coupled to the external device.

Figure 11:
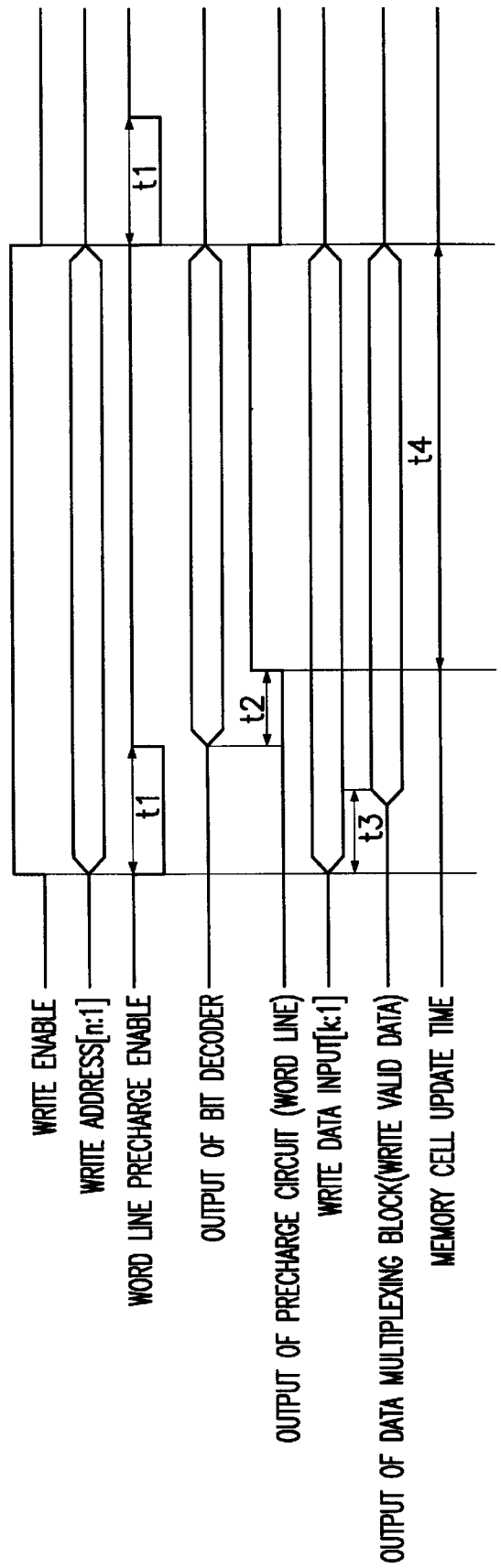
FIG. 11 recites a timing chart of the write operation of the multi-port access memory in accordance with the present invention.
Figure 12:
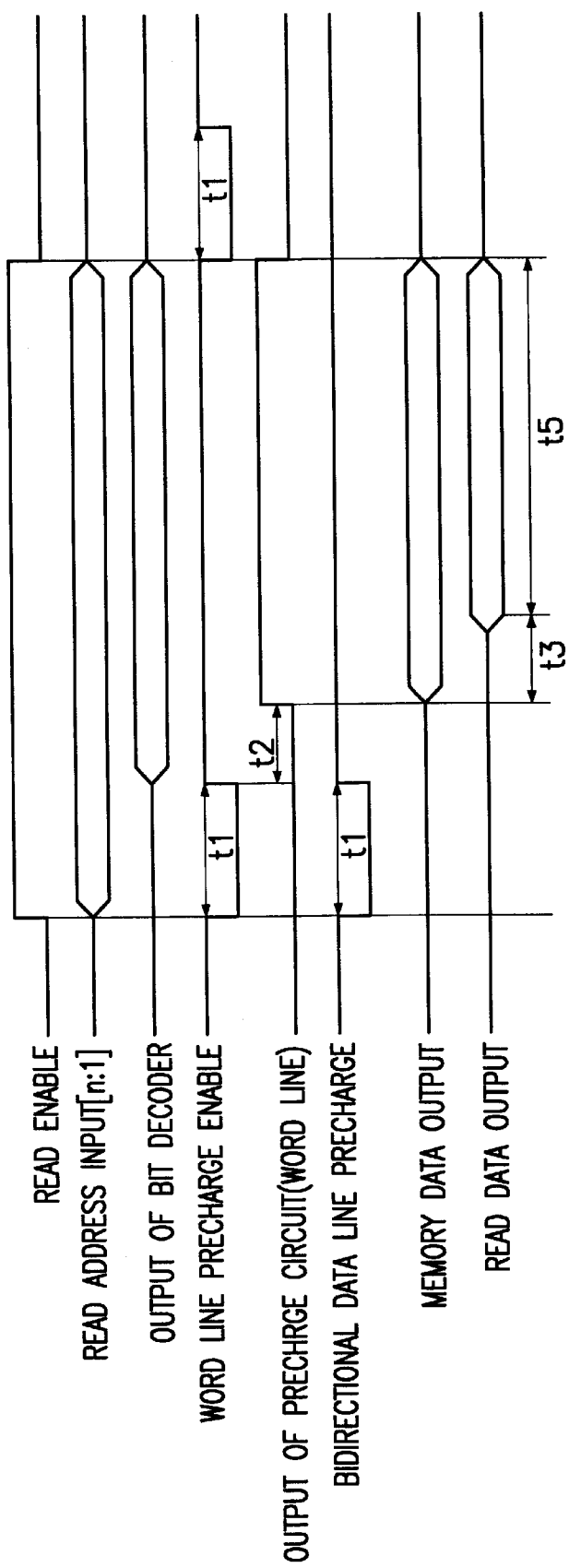
FIG. 12 provides a timing chart of the read operation of the multi-port access memory in accordance with the present invention.

Referring to FIGS. 11 and 12, there are illustrated timing diagrams of the write and the read operations.

When the write enable signal has a high voltage state, an n-bit write address is then received by the multi-port decoders, while, when the read enable signal has a high voltage state, an n-bit read address is received thereby.

A first active time t1 of the precharge enable signal (active low) is identical to the n/2 bit decoding time. In that time, the decode lines are precharged as a high voltage state and the word lines are maintained as a low voltage state.

When the n/2 bit decoding operation is completed, the precharge enable signal is then disabled. In this case, because of the time difference t2 between the outputs of the bit decoders and the output from the precharge circuit, the PMOS transistors 801 and the NAND logic circuits 802 and 803 are simultaneously turned on to thereby effectively prohibit undesired current flowing from the PMOS transistor 801 to the NOR logic 802 and 803.

On the other hand, when the read or write operation is completed, during the second time t1 of the word line precharge enable signal, each of the word line is disabled so that the misoperation of the memory cell is effectively protected.

As shown, a time t3 represents a delay time occurring in the data selection block; a time t4 denotes a memory cell updating time; and a time t5 illustrates a read data valid time.

While the present invention has been shown and described with reference to the particular embodiments, it will be apparent to those skilled in the art that many changes and modifications may be made without departing from the spirit and scope of the invention as defined in the appended claims.

What is claimed is:

1. A multi-port access memory comprising:
    a multi-port access memory cell block for storing data, the multi-port access memory cell block comprising:
        a plurality of memory cells, each having two inverters connected in a direct latch fashion; and
        a number of switching means, each selectively coupling a common bidirectional data line and a memory cell in response to decoded address;
    a number of common decoding means for receiving an address for reading and writing the data and, in response to a read enable signal or a write enable signal, for decoding the address to thereby select one of word lines of the multi-port access memory cell block; and
    data selection means, in response to the write enable signal, for relaying input data via the common bidirectional data line to the multi-port access memory cell block and, in response to the read enable signal, for receiving the data stored in the multi-port access memory cell block to thereby provide the stored data.

2. The multi-port access memory as recited in claim 1, wherein each of the decoding means includes;
    a plurality of decoders for receiving a read address or a write address and for parallelly decoding the read address or the write address in response to the read enable signal or the write enable signal;
    precharge control signal generation means for generating a word line precharge enable signal for use in a precharge operation of decode lines when the read enable signal or the write enable signal is not identical to a delayed read enable signal or a delayed write enable signal; and
    a plurality of precharge means, in response to the precharge enable signal, for precharging the decode lines and for receiving outputs from the plurality of decoders to thereby enable the word lines.

3. The multi-port access memory as recited in claim 2, further comprising inversion means for inverting the read enable signal or the write enable signal to generate an inverted read enable signal or an inverted write enable signal which is coupled to the decodes and the precharge control signal generation means.

4. The multi-port access memory as recited in claim 3, wherein the precharge control signal generation means includes:
    detecting means for receiving and detecting the inverted read enable signal and the inverted write enable signal;
    delay mean for delaying an output from the detecting mean; and
    means for generating the word line precharge enable signal when the delayed output from the delay means is not identical to the output from the detecting means.

5. The multi-port access memory as recited in claim 4, wherein the detecting means includes a NAND logic means for generating a detecting signal as a high voltage state when the inverted read enable signal or the inverted write enable signal is a low voltage level, or both of the inverted read and write enable signals are commonly a low voltage state.

6. The multi-port access memory as recited in claim 5, wherein the word line precharge enable signal generation means includes an NOR logic means for generating the word line precharge enable signal when an output from the NAND logic mean is different from the output from the delay means.

7. The multi-port access memory as recited in claim 6, wherein each of the precharge means includes:

means for precharging the decode lines in response to the word line precharge enable signal outputted from an Exclusive NAND logic means;

first NAND logic means for receiving decoded bits corresponding to a same port and location for the write address from the plurality of decoding means to discharge the decode lines when the decoded bits are identical to each other;

second NAND logic means for receiving decoded bits corresponding to the same port and location for the read address from the plurality of decoding means to discharge the decode lines when the decoded bits are identical to each other; and inversion means for inverting a voltage appearing on the decode lines to thereby enable the word line.

8. The multi-port access memory as recited in claim 7, wherein the means for precharging includes PMOS transistors, gates thereof coupled to the word line precharge enable signal outputted from an Exclusive NOR logic means, for precharging the decode lines as a high voltage state.

9. The multi-port access memory as recited in claim 7, wherein each of the first and the second NAND logic means includes a number of NMOS transistors.

10. The multi-port access memory as recited in claim 1, wherein said each of the switching means includes an NMOS transistor.

11. The multi-port access memory as recited in claim 1, wherein the data selection means includes:

a number of write data transmission means for relaying write data to the bidirectional data lines in response to the write enable signal;

means for precharging the bidirectional data line based on the read enable signal; and a number of read data transmission means for relaying read data to the bidirectional data lines in response to the read enable signal.

* * * * *